United States Patent [19]

Shepherd

[11] Patent Number: 4,781,624
[45] Date of Patent: Nov. 1, 1988

[54] FILTER ARRANGEMENTS AND CONNECTORS

[75] Inventor: Brian Shepherd, Wendover, England

[73] Assignee: Smiths Industries Public Limited Company, London, England

[21] Appl. No.: 154,747

[22] Filed: Feb. 11, 1988

[30] Foreign Application Priority Data

Feb. 11, 1987 [GB] United Kingdom ............... 8703048

[51] Int. Cl.$^4$ ........................................... H01R 13/66
[52] U.S. Cl. .................................... 439/620; 333/181
[58] Field of Search ................. 439/620; 333/181–185

[56] References Cited

U.S. PATENT DOCUMENTS

| | | | |
|---|---|---|---|
| 3,447,104 | 5/1969 | Schor | 333/183 |
| 4,572,600 | 2/1986 | Nieman | 439/620 |
| 4,582,385 | 4/1986 | Couper et al. | 439/620 |
| 4,726,790 | 2/1988 | Hadjis | 439/620 |
| 4,729,743 | 3/1988 | Farrar et al. | 439/620 |
| 4,729,752 | 3/1988 | Dawson, Jr. et al. | 439/620 |

FOREIGN PATENT DOCUMENTS 2137436 10/1984 United Kingdom .

Primary Examiner—Gil Weidenfeld
Assistant Examiner—Gary F. Paumen
Attorney, Agent, or Firm—Pollock, Vande Sande & Priddy

[57] ABSTRACT

A plug-in electrical connector includes a filter assembly formed by a printed circuit board supporting surface mounted capacitors. One electrode of each capacitor is soldered to a peripheral track that is in electrical contact with the outer metal shell of the connector. The other electrode of each capacitor is soldered to respective conductive regions around plated-through apertures. Each aperture contains a socket soldered to it and extending through the board. The sockets have several spring wire elements that establish electrical connection with respective pins 11 that extend through the sockets. One end of each pin is crimped to a respective conductor, the other end of each pin serving to make electrical connection with a cooperating connector. Electrical interference on signals passing via the pins is dissipated to ground via the capacitors.

11 Claims, 4 Drawing Sheets 4,781,624

FILTER ARRANGEMENTS AND CONNECTORS

BACKGROUND OF THE INVENTION

This invention relates to filter arrangements and connectors.

The invention is more particularly concerned with radio frequency interference filters for connectors.

Radio frequency interference filters are commonly included in electrial connectors in order to remove interference coupled into cables, before the interference is able to enter associated electrical equipment.

In one form, these filters employ tubular or discoidal capacitors through which respective pins of the connector extend. The capacitors have one electrode soldered to the contact pin and the other electrode soldered to an earth plate.

Such filters suffer from various disadvantages. Firstly, the capacitors are fragile and liable to damage during termination of the contact pins, when being joined with wires or cables. Furthermore, the connector is expensive and the range of capacitor values is limited, restricting filtering to relatively high frequencies.

Another form of filtered connector is described in GB No. 2137436B. In this connector, the tubular capacitors for filtering are mounted on a separate plug-in assembly which is plugged in series with the connector pins. By isolating connections away from the fragile capacitors the risk of damage is reduced. However, the limitation on capacitor values is still present and there is the disadvantage of the need to make an additional series connection in the electrical path including the connector pins.

A further form of connector is described in EP No. 0124264A. In this, thick film capacitors are deposited on the earth plate, one electrode being connected with the earthed connector shell. The other electrode of the capacitor is permanently connected to the connector pin by means of solder where the pin extends through an aperture in the earth plate. Because the connector pins are connected to the filter array using solder, this makes it difficult to replace the filter array should one of the capacitors fail. Since connectors might have forty or more contact pins each with its own capacitor, there is a significant risk of one or more capacitors failing during assembly, or during termination to cables, or in adverse environments. If the entire connector has to be replaced this is expensive.

BRIEF SUMMARY OF THE INVENTION

It is an object of the present invention to provided an electrical connector which can be used to alleviate these disadvantages.

According to one aspect of the present invention there is provided an electrical connector including a filter assembly and one or more pin elements extending through the connector, the filter assembly comprising a plate member with a conductive region thereon adapted for connection to ground, at least one electrical socket element mounted on and extending through said plate member to receive a respective one of said pin elements, and at least one filtering element mounted on said plate member and connected between said conductive region and the or each respective socket element, the or each said socket element being open at both ends and having a length such that the respective pin element received therein extends through and projects from the socket element such that electrical connection can be established with a co-operating conductor, and the or each said socket element having a resilient contact element which is arranged to provide a sliding contact with the said respective pin element extending through said socket element such that the or each said filtering element thereby provides filtering of signals on the respective pin element.

The socket element preferably includes a plurality of wire spring elements that extend along the socket element obliquely of the socket axis. The plate member may be a printed circuit board including one or more apertures therethrough with an electrically conductive surface, and the or each socket element being received in respective ones of the or each aperture. The or each socket element may be soldered in the respective aperture. The connector may include an outer metal shell, the conductive region being located on the plate member to contact the outer metal shell and establish electrical contact with the shell.

The filtering element preferably includes a surface-mounted capacitor and the connector may include one or more inductive beads through which the or each respective pin element extends, and the or each inductive bead being located to one side of the plate member.

The plate member may be bent within the connector. The or each pin element may have an integral socket adapted to receive therein one end of an electrical connector. The connector may include a plurality of plate members, each plate member having an aperture therethrough within which a socket element extends, and the or each socket element receiving therein a respective pin element.

A connector and various modified connectors, in accordance with the present invention, will now be described, by way of example, with reference to the accompanying drawings.

DETAILED DESCRIPTION

Figure 1:
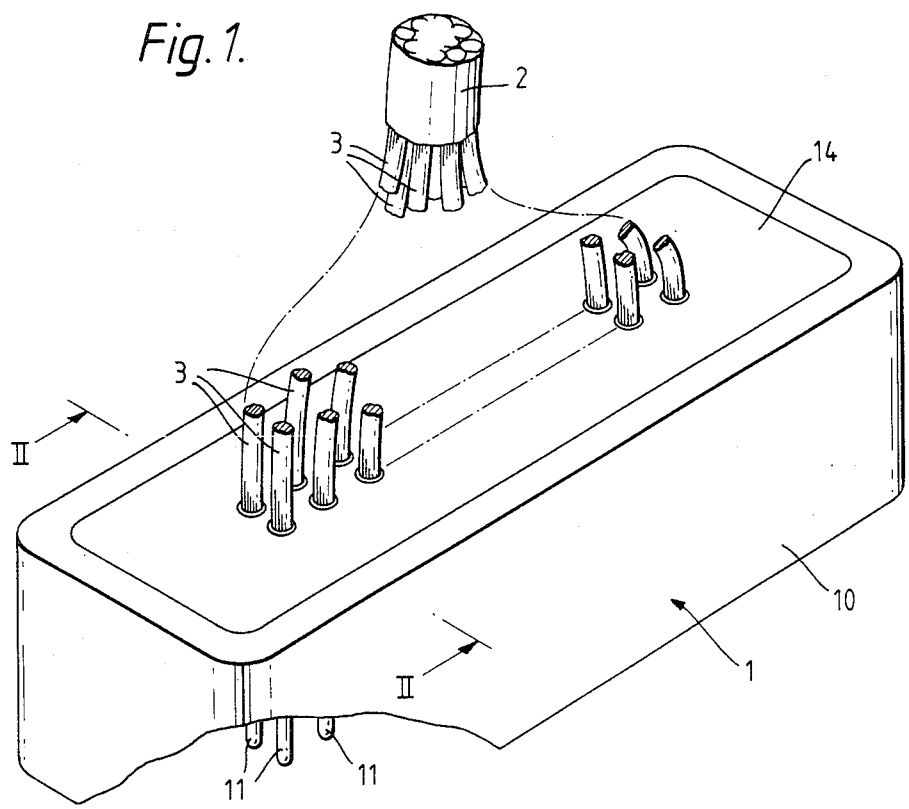
FIG. 1 is a perspective view of the connector.

With reference first to FIG. 1, the connector 1 is connected to one end of a multiple conductor cable 2 and is adapted for making plug-in connection with a co-operating connector, not shown, of conventional construction.

The connector 1 has an outer metal housing or shell 10 of rectangular section which is connected to ground either via a bulkhead mounting flange or by screening on the cable 2 or by a grounded shell on the co-operating connector.

Figure 2:
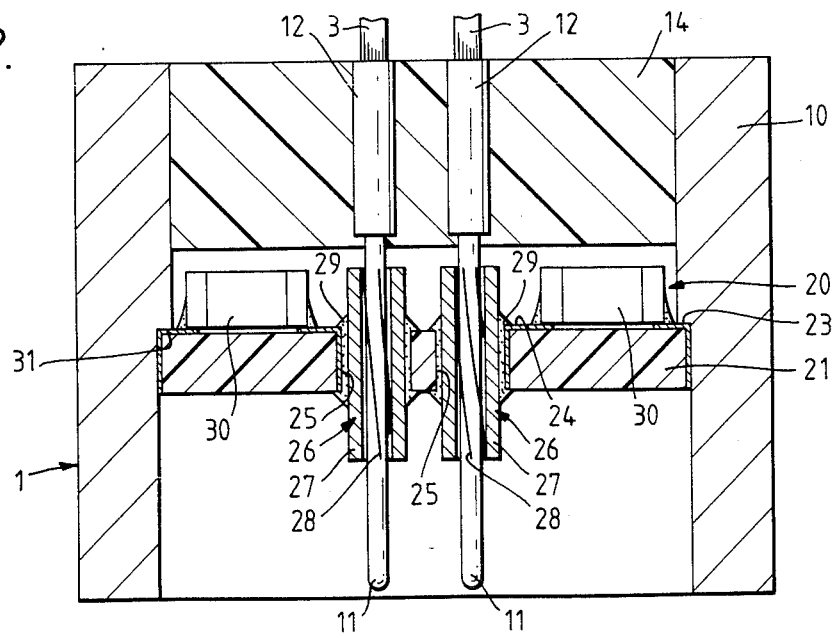
FIG. 2 is a transverse sectional view across the connector of FIG. 1 along the line II—II.
Figure 3:
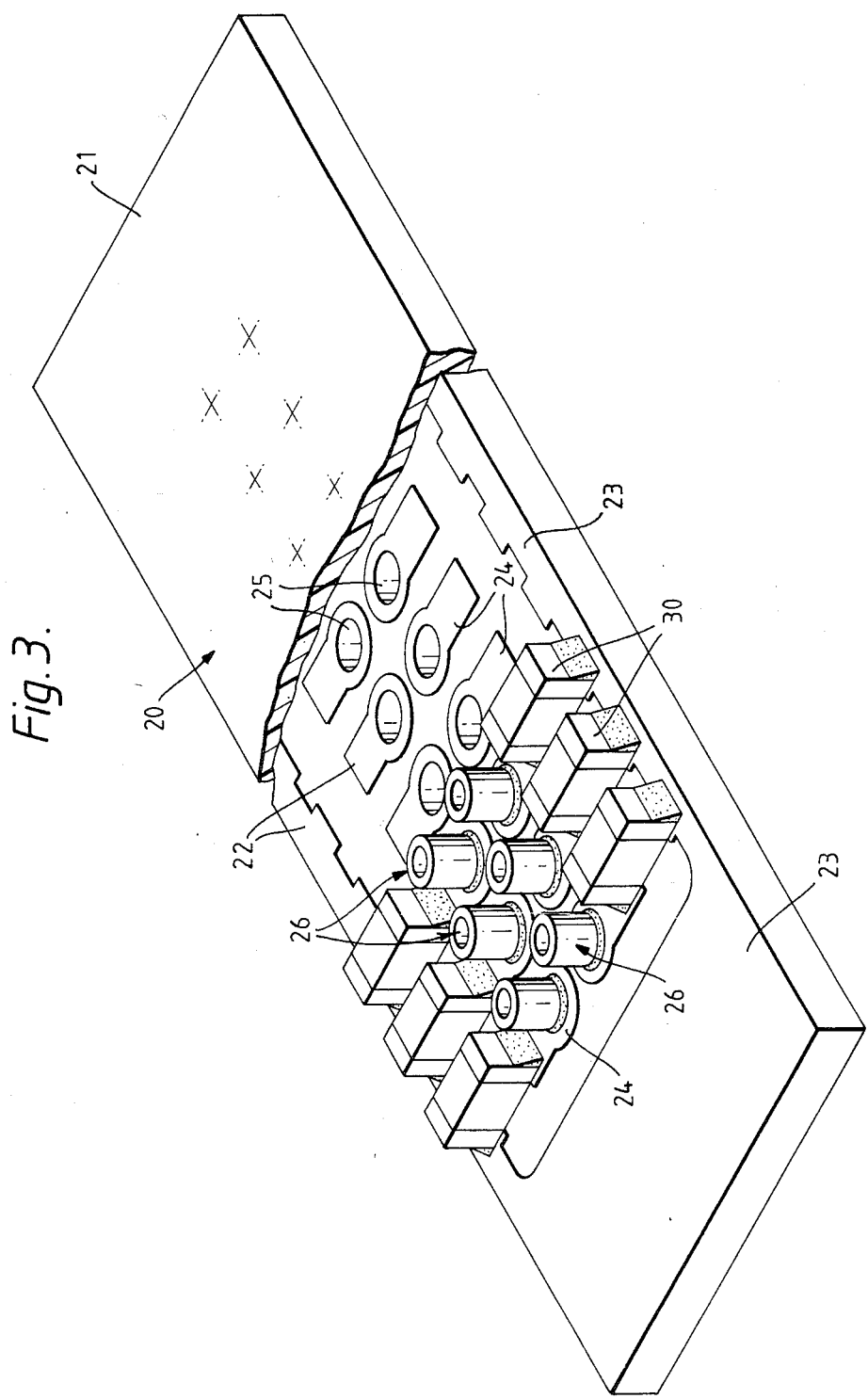
FIG. 3 is a perspective view of a part of the connector.

With reference now also to FIGS. 2 and 3, the connector 1 has two rows of male pin elements 11, one for each of the conductors 3 in the cable 2. The pin elements 11 are of circular section and extend through the connector 1, terminating just above the lower end of the shell 10. At their upper end, the pin elements 11 are each formed with an integral socket 12 which receives a respective one of the conductors 3, the conductors being joined in the sockets, such as by crimping. The upper ends of the pin elements are supported by an insulative body 14 which is pushed into the shell 10.

The connector 1 also includes a filter assembly, indicated generally by the number 20. The filter assembly 20 has a plate member in the form of a rectangular insulating printed circuit board 21 with a pattern of conductive regions 22 on its upper surface. One of the conductive regions is in the form of a peripheral track 23 around the edge of the board. Other conductive regions 24 are formed around each of two rows of apertures 25 in the board and aligned with the pins 11. Each of the regions 24 is isolated from others of the regions 24 and from the peripheral track 23.

Earth path inductance may be reduced and screening improved by one or more additonal layers of coppper on the board 21 which is isolated from the pins 11.

The apertures 25 are of circular section and earth have mounted therein respective electrial socket elements 26. The socket elements 26 No. 863764 and sold under the name Hypertac (RTM). Briefly, these sockets comprise an outer metal tube 27 within which extend several resilient metal wires 28 arranged obliquely of the axis of the tube. In the present invention, the sockets 26 are open at both ends and are shorter than the pin elements 11 such that the pin elements extend through and project from the the lower end of the sockets. These sockets provide a highly reliable sliding contact by engagement of the wires 28 with the pin element 11 inserted in and through the socket. The sockets 26 are each electrically connected to a respective one of the conductive regions 24 on the board 21 by means of solder 29. The apertures 25 are preferably plated through the thickness of the board 21 with the metal forming the conductive regions 24. The outer diameter of the socket tube 27 and of the aperture 25 are such as to allow solder to wick through the aperture around the tube to form a solder joint of larger area. Because the sockets extend through the circuit board 21, contact can be made over a long length of pin, thereby keeping resistance to a minimum, without increasing the height of the connector.

Where filtering is required of any of the pin elements 11, a surface mounted capacitor 30 is connected to the pin element 11. This is done by soldering one electrode of the capacitor 30 to the region 24 around the socket 26, and the other electrode to the peripheral region 23 on the board 21. The filter assembly 20 is assembled in the connector 1 to extend across its width, with the peripheral region 23 on its upper surface in electrical contact with an annular step 31 formed internally around the shell 10. Those of the pin elements 11 where filtering is desired are, in this way, connected to ground via a capacitor 30. Because the capacitors are of standard surface-mounted types, they are available at relatively low cost, in a wide range of values including values suitable for passing relatively low frequencies (below about 1 MHz).

Failure of a part of the filter assembly 20 may reduce filtering of the signals carried by the pins 11, but will not otherwise degrade the signal, in contrast with previous filter assemblies which are serially connected in the signal path. Also, the present construction avoids the need for additional interconnection in the signal path that is necessary with serially connected filter assemblies. If the filter assembly 20 should fail, it can be readily removed and repaired or replaced without the need to discard the entire connector.

During insertion and removal of the connector 1 with a co-operating connector, and during termination with a cable, forces will be communicated to the pin elements 11. Any longitudinal or lateral deflections, or flexing of the pin elements will, however, be readily accommodated by the resilient nature of the sockets 26, without damage.

Damage to the sockets 26 will not generally lead to a complete failure to make electrial connection with the inserted pin, in contrast with solder connections, but will instead result in an increased contact resistance with only a marginally reduction in the efficiency of the filter.

Connectors of this of this kind are particularly suitable for filtering conducted noise from high current switch made power supplies.

Many modifications are possible to the connector.

Figure 4:
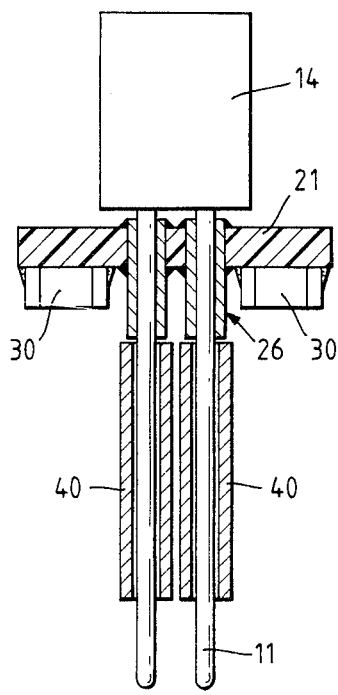
FIGS. 4 to 7 are elevation views showing parts of modified connectors.

For example, as shown in FIG. 4, the filter assembly may include tubular inductor beads 40, such as of a ferrite material, through which the pin elements 11 extend and which provide inductive filtering on one side of the sockets.

Figure 5A:
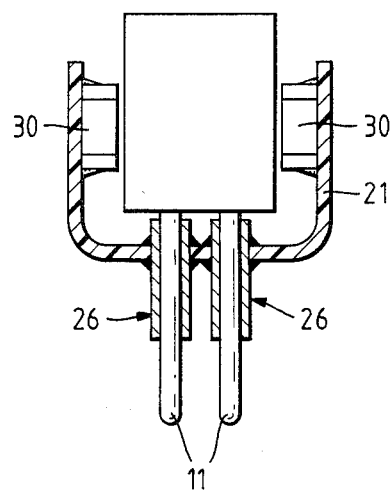
Figure 5B:
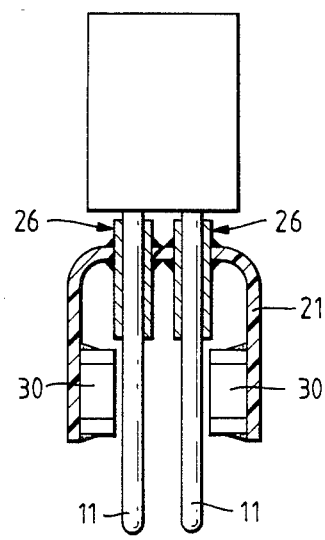

The board 21 on which the filter assembly 20 is formed may be of a rigid material or of a flexible material such as polyamide. The board 21 can be bent to make the best use of available space, as shown in FIGS. 5A and 5B.

Other filtering elements may be used in place of, or in conjunction with, some or all the capacitors on the filter assembly. For example, surge arresting or transient absorbing filtering elements may be used.

Figure 6:
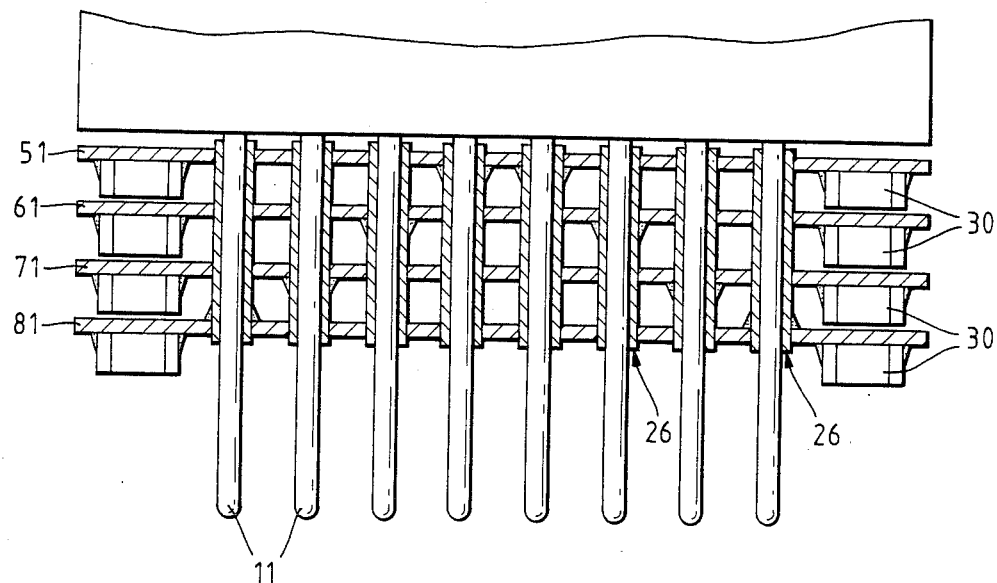

More than one board 51, 61, 71 and 81 could be used, as illustrated in FIG. 6. These can be used to provide more mounting space for the filtering elements, or for enabling more than one filtering element to be connected to each pin.

Figure 7:
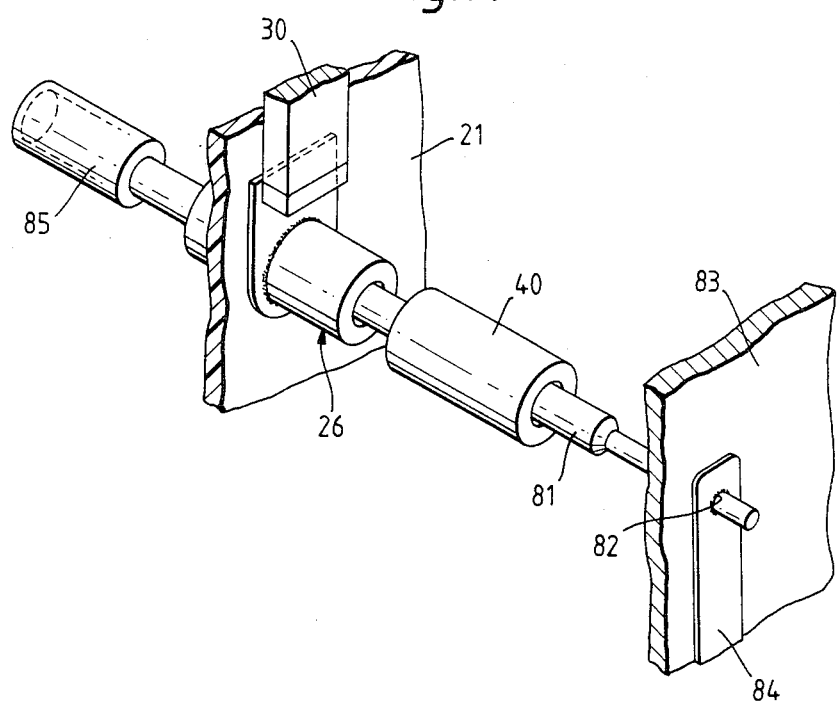

In the previously described connectors, the pin elements 11 have been formed with a female end that is permanently joined to a wire, and a male end that is pluggable into a co-operating mating connector. In the arrangement shown in FIG. 7, by contrast, the male end of each pin element 81 extends through an opening 82 in a flexible printed circuit board 83 and is soldered to a conductive region 84 on the board by which external connection of the connector is established. The female end of the pin elements 81 has a socket 85, such as a Hypertac socket (as defined previously) into which a male pin element of a co-operating connector can be removably inserted.

What is claimed is:

1. An electrical connector comprising: a housing; one or more conductive pin elements supported in said housing; and a filter assembly located in said housing, said filter assembly including a plate member, said plate member having a conductive region thereon that is, in use, connected to ground, and at least one aperture therethrough, at least one electrically conductive socket element inserted into and extending through a respective one of said apertures, at least one filtering element initially seperate from said plate member, and means connecting the or each said filtering element electrically between said conductive region and the or each respective socket element, wherein the or each socket element is open at both ends and has a size and shape such that the or each said socket element receives a respective pin element therein with the pin element projecting from the socket element such that electrical connection can be established by the projecting end of the pin element with a cooperating mating contact, and wherein the or each socket element includes a resilient contact element therein which provides a sliding contact with the said respective pin element extending through the socket element such that the or each said filtering element thereby provides filtering of signals of undesired frequencies on the respective pin element.

2. An electrical connector according to claim 1, wherein the said resilient contact element is provided by a plurality of wire spring elements that extend along the socket obliquely of the length of the socket.

3. An electrical connector according to claim 1, wherein the said plate member is a printed circuit board, and wherein the or each said aperture has an electrically conductive surface that makes electrical connection with the respective socket element.

4. An electrical connector according to claim 3, wherein the or each said socket element is soldered in the said respective aperture.

5. An electrical connector according to claim 1, wherein the said housing is of a conductive material, and wherein the said conductive region is located on the plate member to contact a part of the housing and establish electrical connection therewith.

6. An electrical connector according to claim 1, wherein the said filtering element includes a surface mounted capacitor.

7. An electrical connector according to claim 1, including at least one inductive bead mounted on a respective pin element, the or each said inductive bead being located on one side of said plate member.

8. An electrical connector according to claim 1, wherein the said plate member is bent within the said connector.

9. An electrical connector according to claim 1, wherein the or each pin element has an integral socket, said integral socket being shaped to receive therein one end of an electrical connector.

10. An electrical connector according to claim 1, wherein the connector includes a plurality of plate members, wherein each said plate member has an aperture therein through which a said socket element extends, and wherein said socket element receives therein a respective pin element.

11. An electrical connector comprising: a metal outer shell; a plurality of conductive pin elements supported in said shell; and a filter assembly located in said shell, said filter assembly including an insulative plate member, said plate member having a conductive region thereon in contact with the outer shell, a plurality of electrically conductive apertures through said plate member, a plurality of electrically conductive socket elements inserted into and through respective ones of said apertures, each said socket element having an outer metal tube, said tube being soldered in the respective aperture, and at least one spring contact element in said tube that makes a sliding contact with a respective pin element, the or each said socket element being open at both ends and having a size and shape such that the or each said socket element receives a respective pin element therein with the pin element projecting from the socket element such that electrical connection is established by the contact element with the pin element in the socket element and such that electrical connection can be established by the projecting end of the pin element with a cooperating mating contact, and said filter assembly including a respective capacitor initially seperate from said plate member is connected between said conductive region and a respective one of said socket elements, such that the said capacitor provides filtering of signals of undesired frequencies on the said respective pin element.

* * * * *